(12) United States Patent
Nassikas

(10) Patent No.: US 8,952,773 B2
(45) Date of Patent: Feb. 10, 2015

(54) MAGNETIC PROPULSION DEVICE USING SUPERCONDUCTORS

(76) Inventor: Athanassios A. Nassikas, Larissa (GR)

( * ) Notice: Subject to any disclaimer, the term of this patent is extended or adjusted under 35 U.S.C. 154(b) by 5 days.

(21) Appl. No.: 13/373,403

(22) Filed: Nov. 14, 2011

(65) Prior Publication Data

US 2012/0119857 A1 May 17, 2012

(30) Foreign Application Priority Data

May 15, 2009 (GR) .............................. 20090100276

(51) Int. Cl.
| | |
|---|---|
| H01F 6/00 | (2006.01) |
| H01F 1/00 | (2006.01) |
| H01F 7/00 | (2006.01) |
| H02N 11/00 | (2006.01) |
| G01R 33/3815 | (2006.01) |
| H01F 6/06 | (2006.01) |

(52) U.S. Cl.
CPC .......... *H02N 11/008* (2013.01); *G01R 33/3815* (2013.01); *H01F 6/06* (2013.01)
USPC ............ 335/216; 335/296; 335/299; 335/300

(58) Field of Classification Search
CPC ......... H01F 6/06; H01F 6/00; G01R 33/3815; G01R 33/383
USPC ................... 335/216, 296, 299–300, 302, 306
See application file for complete search history.

(56) References Cited

U.S. PATENT DOCUMENTS

| | | | | | |
|---|---|---|---|---|---|
| 2,938,160 | A | * | 5/1960 | Steele ............................ | 323/368 |
| 3,378,691 | A | * | 4/1968 | Swartz ............................ | 307/91 |
| 3,474,222 | A | * | 10/1969 | Gang ............................ | 219/210 |
| 3,492,738 | A | * | 2/1970 | Simon ............................ | 33/344 |
| 3,504,868 | A | * | 4/1970 | Engelberger ............... | 244/171.1 |
| 3,841,227 | A | * | 10/1974 | Fink ........................ | 104/130.02 |
| 4,937,545 | A | * | 6/1990 | Chaillout et al. ............. | 335/298 |
| 5,023,497 | A | * | 6/1991 | Pereny ............................ | 310/36 |
| 5,276,419 | A | * | 1/1994 | Griffin et al. ................. | 335/216 |
| 8,471,660 | B2 | * | 6/2013 | Rochford et al. ............. | 335/284 |
| 2008/0061782 | A1 | * | 3/2008 | Usagawa ....................... | 324/316 |
| 2012/0124806 | A1 | * | 5/2012 | Rapoport ........................ | 29/428 |

FOREIGN PATENT DOCUMENTS

EP          0645640  A1 *  3/1995

OTHER PUBLICATIONS

A. A. Nassikas, 2010. "Minimum contradictions physics and propulsion via superconducting magnetic field trapping." SPESIF, AIP Conf. Proc. 1208, pp. 339-349.

* cited by examiner

*Primary Examiner* — Mohamad Musleh

(57) ABSTRACT

A device for the creation of propulsive force comprising a magnet, such as a permanent magnet or a superconductive solenoid, fixedly mounted at the narrow end of a converging nozzle made of a superconductor, such as a type II superconductor, e.g. like the rare earth Ba—Cu—O superconductors Sm—Ba—Cu—O or Y—Ba—Cu—O. The magnetic field generated by the interaction of the magnet with the superconducting nozzle due to Meissner effect, acts in the form of pressure on nozzle thereby producing a propulsive force directed toward the nozzle's converging end. The propulsive force being developed may be used for propelling or actuating any machine or vehicle, as well as in the production of energy.

7 Claims, 2 Drawing Sheets

MAGNETIC PROPULSION DEVICE USING SUPERCONDUCTORS

1. INTRODUCTION

Object of the present invention is the description of a propulsive thrust mechanism, consisting of:
  1.1 A magnet like a superconductive solenoid.
  1.2 A magnetic field shield which is manufactured from a superconductor such as a type II rare earth Ba—Cu—O superconductor (like the superconductor Sm—Ba—Cu—O or Y—B—Cu—O), said shield being configured in the form of a nozzle and said magnet being fixedly connected to said shield at its narrow end, the magnetic field of said magnet acting on said shield through the Meissner Effect to create a pressure that develops the intended propulsion.

The development of propulsive thrust by means of a magnetic field is known in the art by publications like:
  H. Johnson, 1995. "Magnetic Propulsion System". U.S. Pat. No. 5,402,021
  M. Brady, 2004. "Permanent Magnet Machine (Perendev)". WO 2006/045333
  Kambe, Yosbitaka (JP)—TOYOTA MOTOR CO LTD (JP). EP0748033

The first two inventions cited above do not describe the use of superconductors.

The third invention does describe the use of superconductors. However, it is unable to achieve self-propulsion, an effect that is achieved by the present invention. The force being developed according to the present invention may be used in the propulsive thrust required for any machine or vehicle, as well as in the production of energy.

2. DRAWINGS

The present invention will be clearly understood by means of the following drawings:

FIG. 1

This figure presents an arrangement that develops a propulsive thrust consisting of a magnet and a converging nozzle made of superconductor, wherein the magnetic field of said magnet acts on the nozzle shield to produce a pressure that creates the intended propulsion.

FIG. 2

Figure 1:
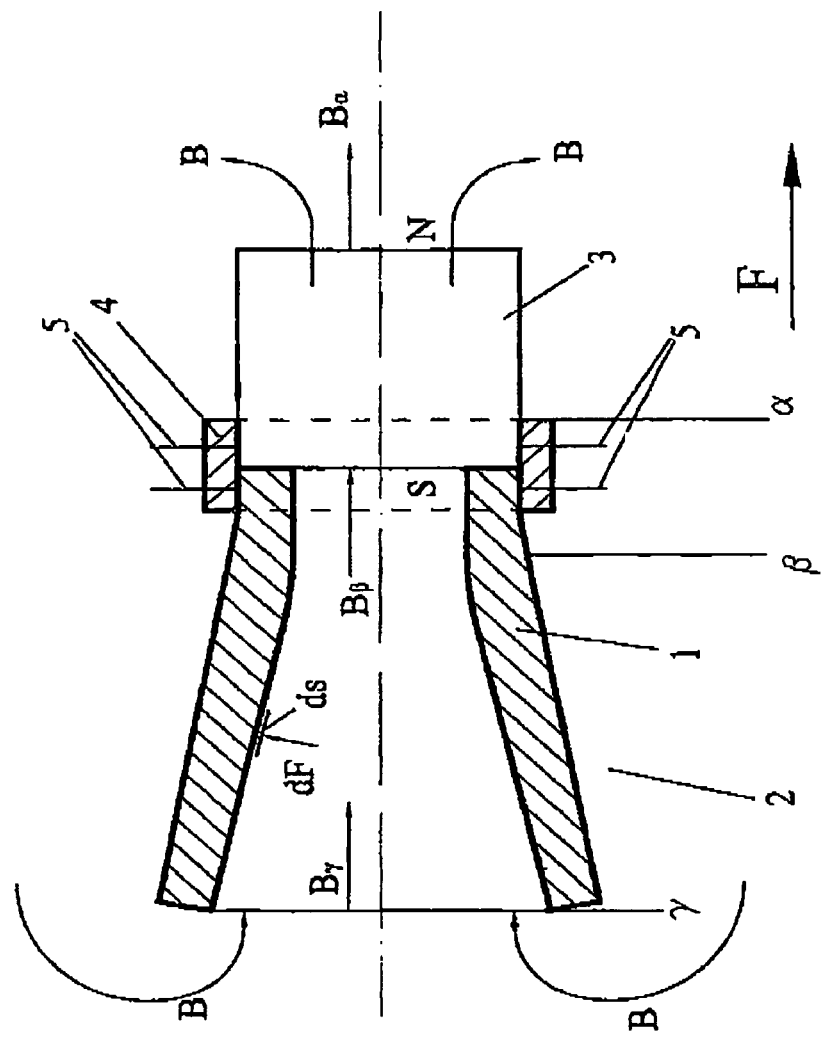

This figure constitutes an alternative arrangement of FIG. 1, having a different connection between the magnet and the converging nozzle.

3. PRINCIPLE OF OPERATION

On the basis of the magnetic field classical theory (Quick Field, Finite Element Systems, User's Guide Version 5.3—Terra Analysis Ltd—2005) the force exerted on a closed surface S is:

$$F = \frac{1}{2} \oint_S \int [H(n \cdot B) + B(n \cdot H) - n(H \cdot B)] dS \quad (1)$$

Where H is the magnetic field intensity, B is the flux density, n is the perpendicular vector to the surface S under consideration, which faces outwardly from it.

In the frame of the present invention, shield signifies the surface boundary of a solid body having a magnetic permeability equal to zero. Such a body prevents an external magnetic field from penetrating through its surface into its interior.

In practice, superconductors function as magnetic field shields, but they lose their shielding properties when the magnetic field becomes too strong. Type II superconductors, like the rare earth Ba—Cu—O superconductors Sm—Ba—Cu—O or Y—Ba—Cu—O, are also confronted with this problem, but they are not perfect shields even at low magnetic field intensities, i.e. they permit a small magnetic field flux to leak through them. Nevertheless they are of interest in the present invention because they maintain most of their shielding properties even at high magnetic field intensities, Whilst the formulae presented below pertain to perfect magnetic field shields, hence to type I superconductors, they nevertheless are also approximately valid for type II superconductors, a fact that can be verified by means of finite element analysis.

Due to equation (1), we have that the force exerted on a magnetic field shielding, where $n \cdot B = 0$ and $n \cdot H = 0$, will be equal to:

$$F = -\frac{1}{2} \oint_S \int n(H \cdot B) dS \quad (2)$$

It means that the force exerted on an elementary section dS will be equal to $$F = -\frac{1}{2} \oint_S \int n(H \cdot B) dS \quad (3)$$

Consequently, a magnetic Geld with properties U and B in the area of an element dS of a shielding of the magnetic field acts in the form of a pressure on the element p, such as:

$$p = \frac{dF}{dS} = -\frac{1}{2} n(H \cdot B) \quad (4)$$

This indicates that, as it is already said, by means of a magnet and a magnetic field shielding it is possible to create magnetic machines, the propulsive force of which is the pressure of equation (4)

The material composing the magnetic field shield can be a superconductor of type I or II creating its shielding effect on the basis of the Meissner Effect. Type I superconductors cannot work under a high value of B, therefore type II superconductors are preferred even though they are not perfect shields and permit a small magnetic field leakage. Superconductors II below a critical temperature and field intensity can trap the magnetic field imposed through vortex current pinning force created canceling the field. Such a material behaves as a solid limit of the magnetic field i.e. as a solid body that is not penetrated by the magnetic field. On the basis of the classical theory of magnetic fields the force on a closed surface S is given by Eq. (1).

Therefore, the force on the nozzle under discussion will be:

$$F \cong \frac{n_\alpha}{2\mu_0}(A_\alpha B_\alpha^2 - A_\gamma B_\gamma^2) = \frac{\Phi n_\alpha}{2\mu_0}(B_\alpha - \beta_\gamma), \quad (6)$$

Figure 2:
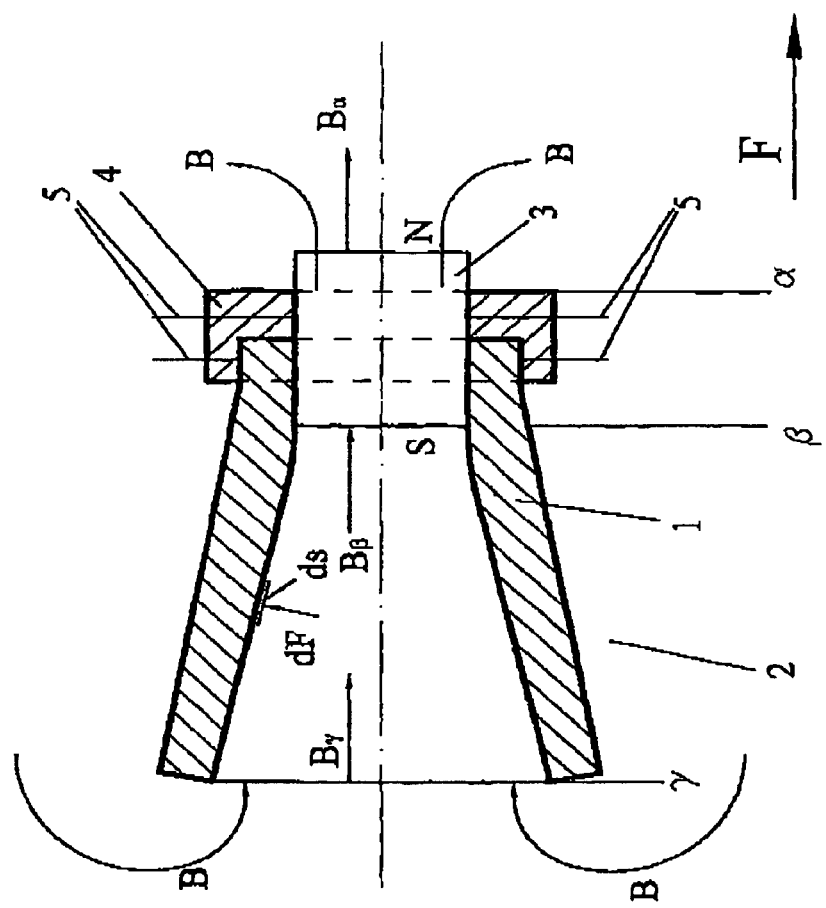

Where, α, γ are the smaller and the bigger section (see FIG. 1 or FIG. 2). Φ magnetic flow, and A the cross sectional area. The above is a simulation of the reaction between the magnetic field and the shield (2) made from the superconductor (1). In reality near a magnetic field shield, the situation is more complicated being affected by quantum phenomena related to the Meissner effect. Based on Eq. (5), we notice that the force created is towards the narrow end of the superconducting nozzle. This is because, due to the Meissner effect and according to Eq. (4 the magnetic field (B) acts as a static pressure on the magnetic field shield. Use of the Quick Field Finite Element analysis program (User's Guide Version 5.3—Terra Analysis Ltd—2005) shows that the force calculated on the arrangements shown in FIG. 1 or FIG. 2 is approximately the same as that calculated using Eq. (5); note that the Quick Field Finite Element analysis program mentioned herein above is widely applied in calculating the magnetic forces created in electromagnetic machines.

The possible violation of the classical principles of physics is due to the use of superconductors, which do not obey Maxwelll's equations. Furthermore it is here noted that London equations do not describe the whole volume of a superconductor, but only the surface region corresponding to the London penetration depth.

Remarks:

1. In order for the superconductor (1) to be capable) of working properly, the systems of FIG. 1 and FIG. 2 must be below the critical temperature Tc for a given magnetic field intensity Hc.

For a given magnetic field intensity, the system may be brought below its critical temperature, Tc, either by immersion of the whole system in liquid helium or liquid nitrogen or by forced circulation of these cryogens within the mechanism of the present invention.

2. The magnet (3) may be either a permanent magnet or a superconductive solenoid for which is required an energy supply, which is not depicted in FIGS. 1 and 2, because this energy supply by itself is not considered to be an inventive step of the present invention.

Regarding the use of superconductive wire for the manufacturing of the "solenoid type" magnet (3), it is well known from the existing references that there are already in operation superconductive solenoids with magnetic fields of the size of 14 T (hypertextbook.com/facts/2000/AnnaWoo.shtml).

3. The magnitudes of the magnetic fields involved in the present invention and of the propulsive forces created thereby may be calculated on the basis of: Quick Field, Finite Element Systems, User's Guide Version 5.3—Terra Analysis Ltd (2005).

4. PREFERRED EMBODIMENTS

Generally, it is an object of the present invention to describe an apparatus for developing a propulsive thrust by means of a converging nozzle (2) made of superconductive material (1) that is able to produce a Meissner effect even in the presence of a high intensity magnetic field, said material acting so as to shield the magnetic field that is created by the magnet (3) which is fixedly attached at the narrow end of the converging nozzle (2), wherein magnet (3) is either a permanent magnet or a superconductive solenoid. According to a first preferred embodiment of the invention being depicted in FIG. 1, the arrangement described hereinabove consists of a superconductive converging nozzle (2) connected at its narrow end with a magnet (3) in such a way that the magnet (3) is situated entirely outside of the nozzle (2). The magnet (3) is fixedly mounted onto the nozzle (2) by means of a coupling (4) and clamping bolts (5), which may be made of a low magnetic permeability material, like Al. The said magnetic field acts on the nozzle shield in the form of a pressure which creates the desired propulsion in the convergence direction. In the case where the developing forces are high, it is possible to reinforce the superconductor (1) with low permeability material, like Al. When the propulsion apparatus of this preferred embodiment is fixed at a constant distance from a shaft, it develops a torque and may be used as an energy production mechanism.

According to a second preferred embodiment of the invention being depicted in FIG. 2, the generally described arrangement consists of a superconductive converging nozzle (2) with a magnet (3) connected at its narrow end in such a way that the magnet (3) extends partially inside the nozzle (2) and partially outside of the nozzle (2), wherein the magnet is fixedly secured to the nozzle by means of a coupling (4) and clamping bolts (5), which may be made of a low magnetic permeability material like Al. The said magnetic field acts on the nozzle-shield in the form of a pressure which creates the desired propulsion in the convergence direction. In the case where the developing forces are high, it is possible to reinforce the superconductor (1) with low permeability material, like Al. When the mechanism of this preferred embodiment is fixedly mounted at a constant distance from a shaft, it develops a torque and may be used as an energy production mechanism.

The invention claimed is:

1. A device for the creation of a propulsive force comprising:
a superconductor magnetic field shield configured in the form of a converging nozzle having an unshielded end opening of larger area and an unshielded end opening of smaller area; a magnetic field source fixedly mounted at the smaller area end opening of said superconductor magnetic field shield; and means for cooling said superconductor magnetic field shield below a critical temperature (Tc) for the maintenance of superconductive conditions; wherein the magnetic field of said magnetic field source exerts a pressure on the boundary surface of said superconductor magnetic field shield, said pressure generating a propulsive force on said device in the direction of nozzle convergence.

2. A device for a creation of a propulsive force as claimed in claim 1, said magnetic field source being a permanent magnet.

3. A device for a creation of a propulsive force as claimed in claim 1, said magnetic field source being a superconductive solenoid.

4. A device for a creation of a propulsive force as claimed in claim 1, said entirety of said magnetic field shield and said magnetic field source being immersed within said means for cooling said superconductor magnetic field shield.

5. A device for a creation of a propulsive force as claimed in claim 1, said entirety of said magnetic field shield and said magnetic field source being subjected to forced circulation of said means for cooling said superconductor magnetic field shield.

6. A device for the creation of a propulsive force as claimed in claim 1, said magnetic field source being either a permanent magnet or a superconductive solenoid fixedly mounted at the smaller area end opening of said converging nozzle by means of a coupling member and clamping bolts, said permanent magnet or superconductive solenoid extending partially inside and partially outside of said nozzle, said coupling member and clamping bolts being made from a material of low magnetic permeability, said propulsive force being applied in the direction of said nozzle's convergence.

7. A device for the creation of a propulsive force as claimed in claim 1, said magnetic field source being either a permanent magnet or a superconductive solenoid fixedly mounted at the narrow end said converging nozzle by means of a coupling member and clamping bolts, said permanent magnet or superconductive solenoid lying entirely outside of said nozzle, said coupling member and clamping bolts being made from a material of low magnetic permeability, said propulsive force being applied in a the direction of said nozzle's convergence.

\* \* \* \* \*